United States Patent
Allman et al.

(10) Patent No.: US 7,023,067 B2
(45) Date of Patent: Apr. 4, 2006

(54) BOND PAD DESIGN

(75) Inventors: Derryl D. J. Allman, Camas, WA (US); Charles E. May, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 78 days.

(21) Appl. No.: 10/341,082

(22) Filed: Jan. 13, 2003

(65) Prior Publication Data

US 2004/0135223 A1    Jul. 15, 2004

(51) Int. Cl.
    *H01L 31/10*    (2006.01)

(52) U.S. Cl. ............... 257/459; 257/773; 257/736; 257/786; 257/758; 257/676; 257/702; 257/748; 257/701; 257/759

(58) Field of Classification Search ............ 257/459, 257/786, 758, 676, 702, 748, 773, 736, 759, 257/648

See application file for complete search history.

(56) References Cited

U.S. PATENT DOCUMENTS

| | | | | |
|---|---|---|---|---|
| 6,100,589 A | * | 8/2000 | Tanaka | 257/758 |
| 6,251,789 B1 | * | 6/2001 | Wilson et al. | 438/693 |
| 6,297,562 B1 | * | 10/2001 | Tilly | 257/780 |
| 6,657,302 B1 | * | 12/2003 | Shao et al. | 257/758 |
| 2002/0145201 A1 | * | 10/2002 | Armbrust et al. | 257/776 |

\* cited by examiner

*Primary Examiner*—Eddie Lee
*Assistant Examiner*—Junghwa Im
(74) *Attorney, Agent, or Firm*—Luedeka, Neely & Graham, P.C.

(57) ABSTRACT

A bonding pad for an integrated circuit, where the bonding pad overlies a fragile dielectric layer. A lower metal layer stack overlies the fragile dielectric layer, and a hard dielectric layer overlies the lower metal layer stack. An upper metal layer stack overlies the hard dielectric layer, where the upper metal layer stack forms voids extending into the upper metal layer stack from an exposed upper surface of the upper metal layer stack. The voids define deformable protrusions in the upper surface of the upper metal layer stack, for at least partially absorbing forces applied to the bonding pad during a bonding operation. Electrically conductive vias extend from the lower metal layer stack through the hard dielectric layer to the upper metal layer stack, and electrically connect the lower metal layer stack to the upper metal layer stack.

13 Claims, 4 Drawing Sheets

BOND PAD DESIGN

FIELD

This invention relates to the field of integrated circuit fabrication. More particularly, this invention relates to the design of bonding pads for use over fragile materials, such as low k dielectrics.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Concerning the problem of thermal coefficient of expansion, when adjacent layers having different thermal coefficients of expansion are heated and cooled, such as occurs during the normal operation of an integrated circuit, the layers tend to expand and contract at different rates and to different degrees. These forces induce strains in the adjacent and proximal layers. Low k materials tend to have thermal coefficients of expansion that are sufficiently different from those of the other materials used to fabricate integrated circuits, that such strains create problems, which may be both physical and electrical, in the integrated circuit.

As to the problem of moisture absorption, the porosity of low k materials makes them susceptible to absorbing the moisture that typically tends to diffuse into the packaged integrated circuit. As the low k material absorbs such moisture, the properties of the low k material changes. For example, the dielectric constant of the material changes, because the voids tend to fill with water or water vapor. The moisture in the voids may rapidly expand during subsequent heating operations such as baking or solder ball reflow, causing the layers of the integrated to burst apart, resulting in dramatic device failure. The moisture absorbed by the low k material also tends to cause other problems, some of which are described in more detail below.

Integrated circuits containing low k materials are inherently more prone to delamination, either between the various layers of the integrated circuit itself, or between the integrated circuit and packaging materials such as underfill and mold compound, or other materials which are in intimate contact with the integrated circuit. There are several probable causes for such delamination, including a reduction in the adhesion of a low k layer due to absorption of moisture, as described above. In addition, because the low k material tends to be very porous by nature, there is physically less material available to form adhesive bonds with adjacent layers. Further, the strains induced by differing thermal coefficients of expansion also tend to shear the low k layer from adjacent layers, which again tends to enhance the occurrence of delamination.

As to mechanical strength, low k materials are typically more brittle and have a lower breaking point than other materials. One reason for this is, again, the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, or temperature cycling.

Finally, because of their porosity and other properties, low k materials tend to be very poor thermal conductors, typically much less than half a watt per meter-Kelvin (W/mK). This contrasts significantly with the thermal conductivity of traditional integrated circuit and packaging materials such as silicon (60–90 W/mK), copper 380–390 W/mK), mold compound (0.7–2 W/mK), or die attach material (2–4 W/mK). Thus, the thermal energy created during the normal operation of the integrated circuit tends to not be dissipated well by low k materials. Therefore, thermal energy tends to build up within the integrated circuit, and is expressed as localized areas of increased temperature, or hot spots.

There is a need, therefore, for new structures, processes, and materials for use in integrated circuit fabrication, which help to alleviate one or more of the challenges that are enhanced by the use of low k materials.

SUMMARY

The above and other needs are met by a bonding pad for an integrated circuit, where the bonding pad overlies a fragile dielectric layer. A lower metal layer stack overlies the fragile dielectric layer, and a hard dielectric layer overlies the lower metal layer stack. An upper metal layer stack overlies the hard dielectric layer, where the upper metal layer stack forms voids extending into the upper metal layer stack from an exposed upper surface of the upper metal layer stack. The voids define deformable protrusions in the exposed upper surface of the upper metal layer stack, for at least partially absorbing forces applied to the bonding pad during a bonding operation. Electrically conductive vias extend from the lower metal layer stack through the hard dielectric layer to the upper metal layer stack, and electrically connect the lower metal layer stack to the upper metal layer stack.

In this manner, the deformable protrusions in the upper metal layer stack absorb at least some of the forces that are normally applied to a bonding pad during a bonding operation. These applied forces are often sufficient to crack the fragile underlying dielectric layer. However, because the protrusions in the upper metal layer stack are deformable, they absorb a portion of the applied forces and thus offer some protection to the fragile dielectric layer, thereby reducing and preferably eliminating the occurrence of cracking within the fragile dielectric layer.

In various preferred embodiments of the invention, the fragile dielectric layer is a low k dielectric layer, and the hard dielectric is a silicon dioxide layer. The lower metal layer stack preferably comprises a lower layer of titanium, an intermediate layer of titanium nitride, and an upper layer of aluminum, and the upper metal layer stack also preferably comprises a lower layer of titanium, an intermediate layer of titanium nitride, and an upper layer of aluminum. The voids in the upper metal layer stack preferably extend vertically completely through the upper metal layer stack. Preferably the upper metal layer stack includes a lower layer of titanium having a thickness that is no greater than about one hundred angstroms. The voids in the upper metal layer stack in one embodiment are formed in an array of intersecting lines, and the protrusions in the upper metal layer stack are pillar shaped. In an alternate embodiment the voids in the upper metal layer stack are formed in an array of non intersecting lines, and the protrusions in the upper metal layer stack are bar shaped.

The lower metal layer stack preferably also forms voids extending into the lower metal layer stack from an interface between the hard dielectric layer and an upper surface of the lower metal layer stack. The voids are filled with material of the hard dielectric layer, and define protrusions in the upper surface of the lower metal layer stack for at least partially arresting cracks created in the hard dielectric layer during a bonding operation. Preferably the voids in the lower metal layer stack extend vertically completely through the lower metal layer stack.

Also described herein is a monolithic integrated circuit including the bonding pad described above, and a packaged integrated circuit having a monolithic integrated circuit including the bonding pad described above.

Additionally described is a bonding pad for an integrated circuit, where the bonding pad overlies a fragile dielectric layer. A lower metal layer stack overlies the fragile dielectric layer, where the lower metal layer stack forms voids extending into the lower metal layer stack from an upper surface of the lower metal layer stack. The voids define protrusions in the upper surface of the lower metal layer stack. A hard dielectric layer overlies the lower metal layer stack, and fills the voids of the lower metal layer stack. The protrusions of the lower metal layer stack at least partially arrest cracks created in the hard dielectric layer during a bonding operation.

An upper metal layer stack overlies the hard dielectric layer, where the upper metal layer stack forms voids extending into the upper metal layer stack from an exposed upper surface of the upper metal layer stack. The voids define deformable protrusions in the exposed upper surface of the upper metal layer stack, and at least partially absorb forces applied to the bonding pad during a bonding operation. Electrically conductive vias extend from the lower metal layer stack through the hard dielectric layer to the upper metal layer stack, and electrically connect the lower metal layer stack to the upper metal layer stack.

Further described is a method for forming a bonding pad overlying a fragile dielectric layer in an integrated circuit. A lower metal layer stack is formed over the fragile dielectric layer, and a hard dielectric layer is formed over the lower metal layer stack. Electrically conductive vias are formed, extending from the lower metal layer stack through the hard dielectric layer. An upper metal layer stack is formed overlying the hard dielectric layer, where the electrically conductive vias electrically connect the lower metal layer stack to the upper metal layer stack. Voids extending into the upper metal layer stack from an exposed upper surface of the upper metal layer stack are formed, where the voids define deformable protrusions in the exposed upper surface of the upper metal layer stack. The protrusions at least partially absorb forces applied to the bonding pad during a bonding operation.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
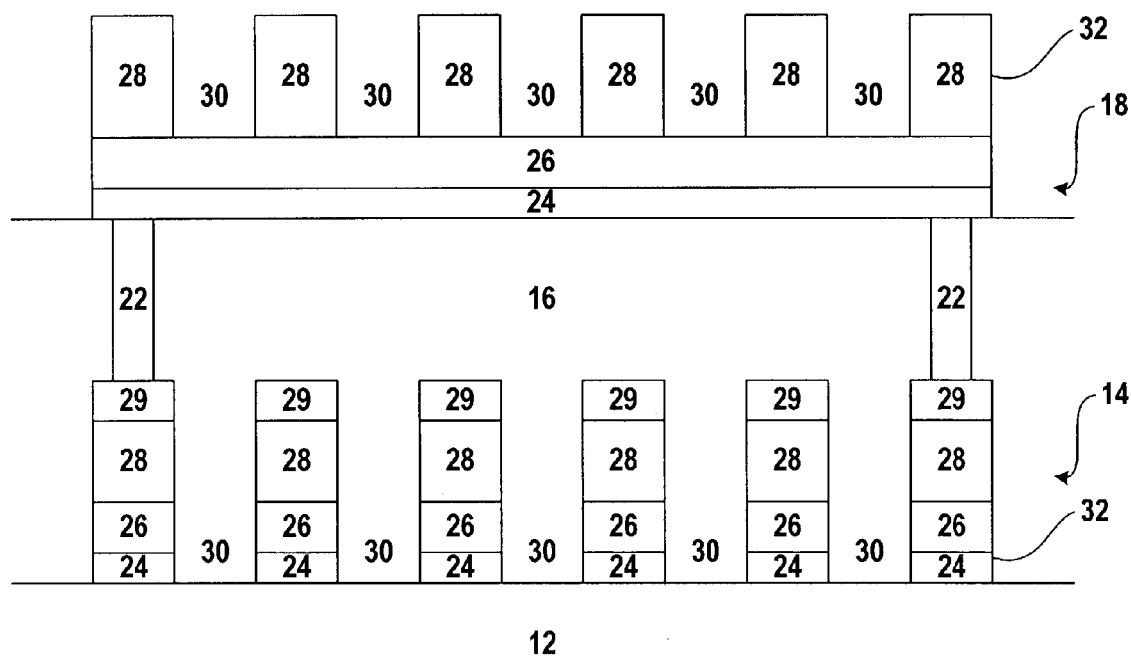
FIG. 1 is a cross sectional view of a portion of a monolithic integrated circuit, depicting a fragile dielectric layer, a lower metal layer stack, a hard dielectric layer, and an upper metal layer stack.

With reference now to FIG. 1, there is depicted a cross sectional view of a portion of a monolithic integrated circuit 10, depicting a fragile dielectric layer 12, and a bonding pad with a lower metal layer stack 14, a hard dielectric layer 16, and an upper metal layer stack 18. Electrically conductive vias 22 extend through the hard dielectric layer 16 from the lower metal layer stack 14 to the upper metal layer stack 18, and form electrical connections between the lower metal layer stack 14 and the upper metal layer stack 18.

The fragile dielectric layer 12 is preferably a low k dielectric layer, and thus there is a tendency for the fragile dielectric layer 12 to crack and otherwise fracture when forces are applied to the bonding pad during a bonding operation. The bonding pad according to the invention described herein has structures to reduce and preferably eliminate such fractures in the fragile dielectric layer 12.

Both the lower metal layer stack 14 and the upper metal layer stack 18 are preferably formed of layers of more than one metal or metallic compound. For example, in the bonding pad depicted in FIG. 1, both the lower metal layer stack 14 and the upper metal layer stack 18 each have a lower layer 24 of titanium, a middle layer 26 of titanium nitride, and a top layer 28 of aluminum. FIG. 1 also depicts an optional overlying layer of titanium nitride 29 on the top of the lower metal layer stack 14, which is preferably between about three hundred angstroms and about seven hundred angstroms in thickness.

It is appreciated that the lower metal layer stack 14 and the upper metal layer stack 18 do not need to be formed of exactly the same materials or of the same number of layers, or with the same thicknesses. In addition, a smaller or greater number of layers and different materials than that as described herein may be used. It is further appreciated that both the lower metal stack 14 and the upper metal stack 18 can be formed of either aluminum based interconnect materials or copper based interconnect materials. The examples herein primarily describe embodiments of the invention that use aluminum based interconnect materials. However, it is appreciated that copper based materials are also contemplated.

Figure 5:
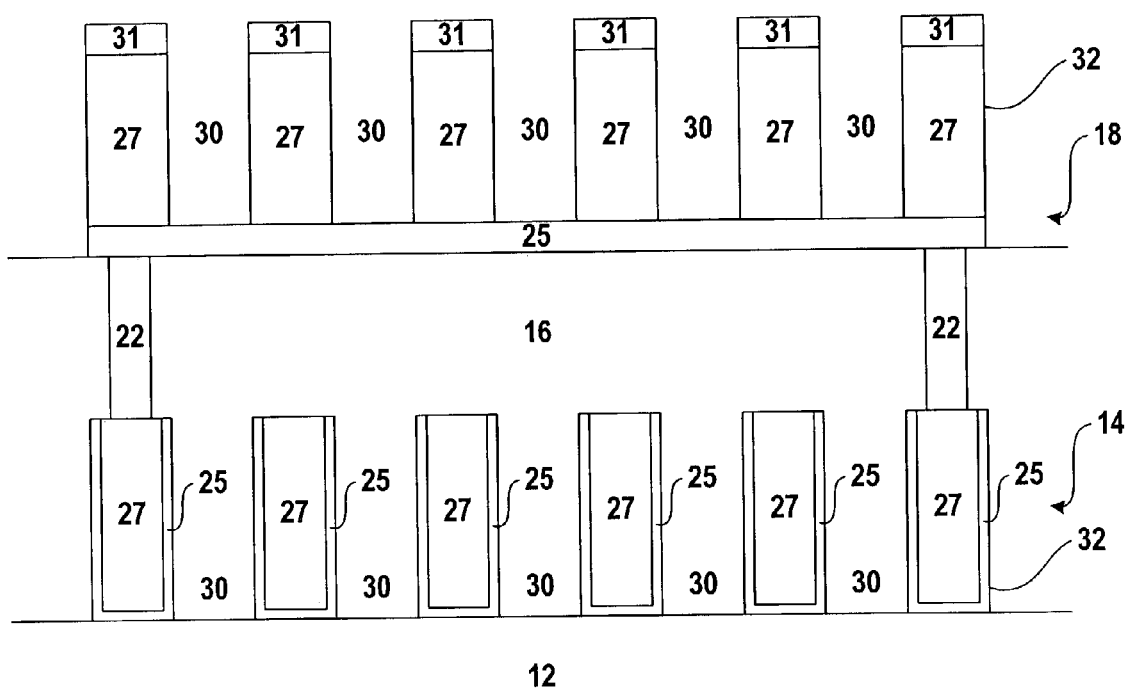
FIG. 5 is a cross sectional view of a portion of a monolithic integrated circuit, depicting a fragile dielectric layer, a lower metal layer stack, a hard dielectric layer, and an upper metal layer stack, where the metal layer stacks are copper based.

In the case where copper is used, the structure is preferably formed by a damascene process, where the copper 27 of the lower metal layer stack 14 is surrounded on three sides by a barrier layer of tantalum nitride 25, or some other material having similar properties that is compatible with the processes, materials, and structures as described herein. The barrier layer of tantalum nitride 25 preferably resides below the copper layer 27 in the upper metal layer stack 18. If the top surface of the copper layer 27 of the upper metal layer 18 is not left open, such as for solder bump bonding or ball bonding, then the top surface of the copper layer 27 is preferably covered with a layer 31 of silicon carbide, or alternately silicon nitride. Copper embodiments of the structure are depicted in FIG. 5.

Most preferably, the lower titanium layer 24 of the upper metal layer stack 18 is no greater than about one hundred angstroms in thickness, so as to reduce the tensile stress between the upper metal layer stack 16 and the underlying hard dielectric layer 16, thus reducing the energy available at the interface of the two layers 16 and 18 that can initiate cracking.

The hard dielectric layer 16 disposed between the upper metal layer stack 18 and the lower metal layers stack 14 is preferably formed of an oxide, and most preferably a silicon oxide. Silicon dioxide is especially preferred because the processes for forming it are relatively well understood, and silicon dioxide is typically used for other layers in the integrated circuit 10, so the equipment and materials needed to form the layer are readily available. Further, silicon dioxide is relatively hard, especially in comparison to low k materials, and also in comparison to metals. Thus, the hard silicon dioxide provides good structure strength to the bonding pad in general, and to the fragile dielectric layer 12 in particular.

Figure 2:
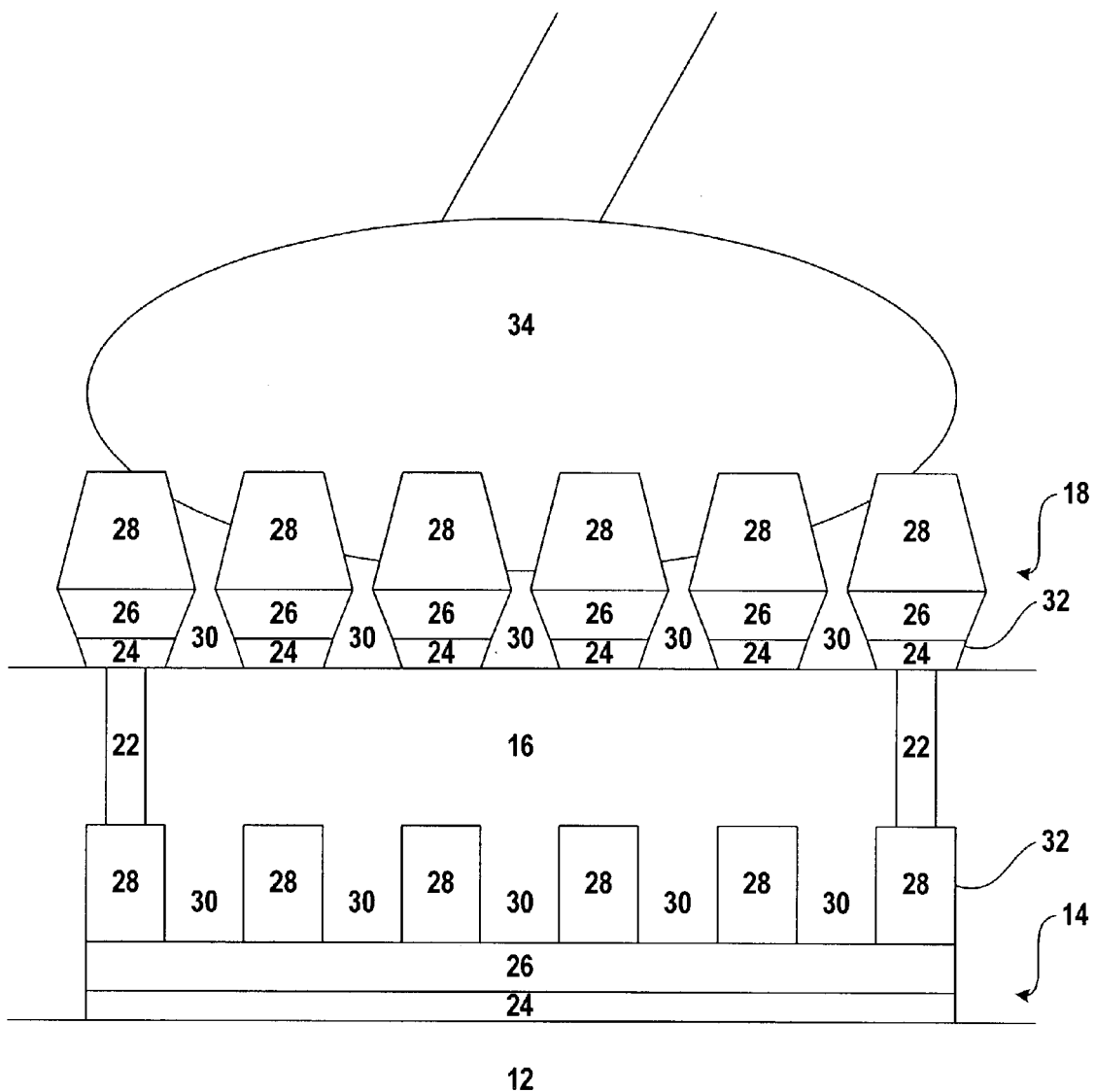
FIG. 2 is a cross sectional view of a portion of a packaged integrated circuit, depicting a fragile dielectric layer, a lower metal layer stack, a hard dielectric layer, and an upper metal layer stack, where a ball bond has been formed on the upper metal layer stack.

As depicted in FIG. 1, voids 30 are preferably formed in the upper metal layer stack 18, extending from an exposed upper surface of the upper metal layer stack 18 down into the upper metal layer stack 18. The voids 30 may either extend only partially into the upper metal layer stack 18, as depicted in FIG. 1, or may extend completely through the upper metal layer stack 18, as depicted in FIG. 2. The voids 30 define protrusions 32 in the upper metal layer stack 18. The protrusions 32 may have one or more of a variety of shapes, depending upon the configuration of the voids 30 in the upper metal layer stack 18.

As depicted in FIG. 1, voids 30 are also preferably formed in the lower metal layer stack 14, extending from an upper surface of the lower metal layer stack 14 down into the lower metal layer stack 14. The voids 30 may either extend only partially into the lower metal layer stack 14, as depicted in FIG. 2, or may extend completely through the lower metal layer stack 14, as depicted in FIG. 1. The voids 30 define protrusions 32 in the lower metal layer stack 14. The protrusions 32 may have one or more of a variety of shapes, depending upon the configuration of the voids 30 in the lower metal layer stack 18. In some embodiments, the lower metal layer stack 14 does not have any voids 30 at all, but is instead a contiguous metal layer stack without discrete defined protrusions 32.

With reference now to FIG. 2, there is depicted a cross sectional view of a portion of a packaged integrated circuit 34, depicting the fragile dielectric layer 12, the lower metal layer stack 14, the hard dielectric layer 16, the upper metal layer stack 18, the electrically conductive vias 22, and a ball bond 36 formed on the upper metal layer stack 18. As can be seen in FIG. 2, when the forces are applied during the formation of the ball bond 36, the protrusions 32 in the upper metal layer stack 18 deform, thus absorbing at a least a portion of the applied forces. By absorbing these forces in this manner, the protrusions 32 of the upper metal layer stack 18 tend to protect the fragile dielectric layer 12, and thereby reduce and preferably eliminate cracking in the fragile dielectric layer 12 due to the applied forces during a ball bonding operation.

Further, any cracks that might be generated in the hard dielectric layer 16 tend to be halted when they encounter the lower metal layer stack 14. This termination of any such cracks tends to prevent the cracks from reaching and propagating through the fragile dielectric layer 12. Such termination of cracks tends to occur both when the lower metal layer stack 14 is a contiguous sheet without voids 30 and protrusions 32 and also when the lower metal layer stack 14 does have voids 30 and protrusions 32. However, when the voids 30 and protrusions 32 are formed in the lower metal layer stack 14, there is a greater effective amount and thickness of the hard dielectric material 16, which tends to provide an even greater amount of structural strength to the bonding pad. Thus, it is preferred to have the voids 30 and protrusions 32 formed in the lower metal layer stack 14.

Figure 3:
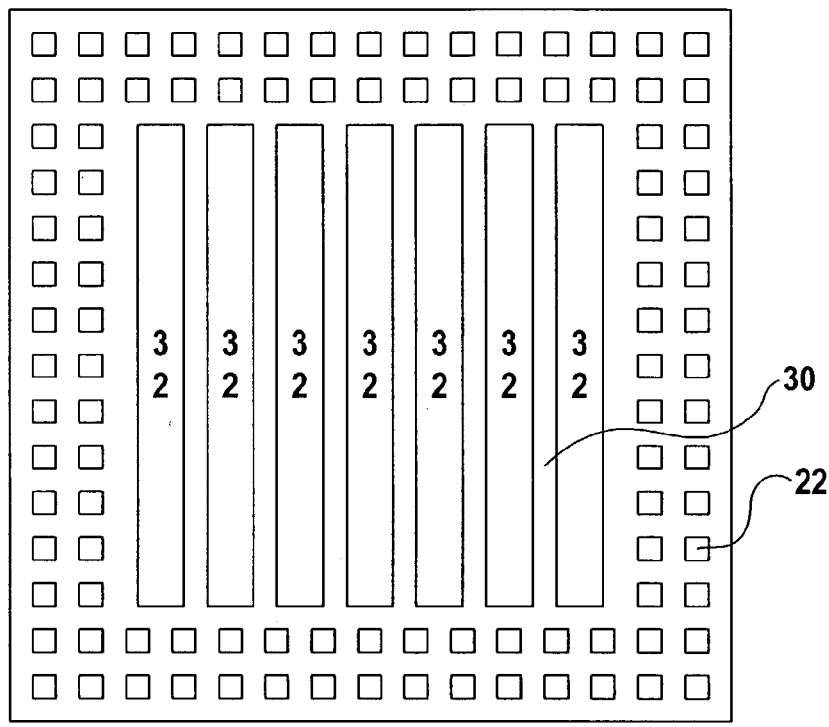
FIG. 3 is a top plan view of a bonding pad on a monolithic integrated circuit, depicting a slotted configuration of the voids and protrusions in either the lower metal layer stack or the upper metal layer stack.
Figure 4:
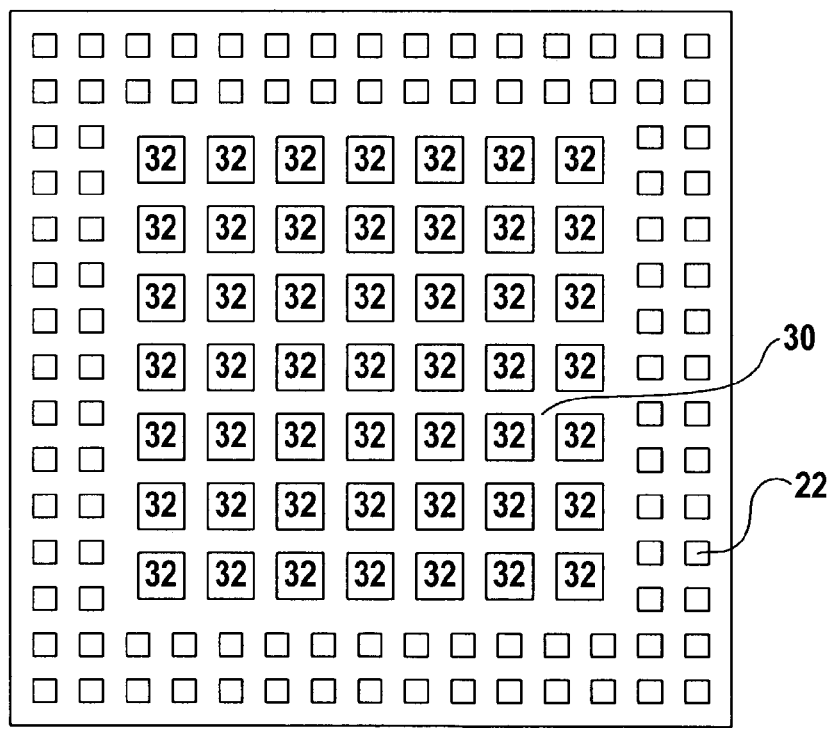
FIG. 4 is a top plan view of a bonding pad on a monolithic integrated circuit, depicting a waffle configuration of the voids and protrusions in either the lower metal layer stack or the upper metal layer stack.

With reference now to FIG. 3, there is depicted a top plan view of the bonding pad, showing one embodiment for the voids 30 and the protrusions 32 in either the upper metal layer stack 18 or the lower metal layer stack 14. In the embodiment depicted in FIG. 3, the voids are formed as non intersecting lines, slots, or trenches, thus shaping the protrusions 32 as bars. As depicted in FIG. 4, the voids are formed as intersecting lines, in somewhat of a waffle shape, thus shaping the protrusions 32 as pillars. It is appreciated that other configurations and shapes are also within the comprehension of the present invention, and that the upper metal layer stack 18 and the lower metal layer stack 14 need not both have the same shaped voids 30 and protrusions 32. It is further appreciated that a variety of shapes of voids 30 and protrusions 32 may be used on a single one of both of the upper metal layer stack 18 and the lower metal layer stack 14.

It is appreciated that the protrusions 32 formed as described above may be of any thickness and size. However, in a most preferred embodiment, the thickness of the protrusions 32 is determined at least in part by the thickness of the layer in which they are formed, which thickness is set by other criteria as known in the art. Further, there are preferably a far greater number of protrusions 32 than that as depicted in the figures. Only a relatively few protrusions 32 are depicted in the figures so as to not unnecessarily encumber the figures with detail that is not essential to understanding the invention. However, the protrusions 32 are preferably given a height and width such that they can perform the functions as described herein without experiencing mechanical failure. For example, the protrusions 32 in the upper metal layer stack 18 are preferably formed with a size such that a reliable ball bond 36 can be formed to them, and such that they do not break off with the ball bond 36.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A bonding pad for an integrated circuit, where the bonding pad overlies a fragile dielectric layer, the bonding pad comprising:
    a lower metal layer stack overlying the fragile dielectric layer, where the lower metal layer stack forms voids extending into the lower metal layer stack from an upper surface of the lower metal layer stack, the voids defining protrusions in the upper surface of the lower metal layer stack, where the voids in the lower metal layer stack do not extend completely through the lower metal layer stack,
    a hard dielectric layer overlying the lower metal layer stack, including the protrusions of the lower metal layer stack, the hard dielectric layer filling the voids of the lower metal layer stack but not disposed within an interior portion of the protrusions of the lower metal layer stack, the protrusions of the lower metal layer stack for at least partially arresting cracks in the hard dielectric layer,
    an upper metal layer stack overlying the hard dielectric layer, where the upper metal layer stack forms voids extending into the upper metal layer stack from an exposed upper surface of the upper metal layer stack, the voids defining deformable protrusions in the exposed upper surface of the upper metal layer stack for at least partially absorbing forces applied to the bonding pad during a bonding operation, where the voids in the upper metal layer stack do not extend completely through the upper metal layer stack, and no solid material is disposed between the deformable protrusions of the upper metal layer stack, and
    electrically conductive vias extending from the lower metal layer stack through the hard dielectric layer to the upper metal layer stack and electrically connecting the lower metal layer stack to the upper metal layer stack, where,
        neither the lower metal layer stack nor the upper metal layer stack include any electrically conductive vias or layers in which electrically conductive vias reside, and the electrically conductive vias between the lower metal layer stack and the upper metal layer stack are disposed exclusively between an upper most surface of the protrusions of the lower metal layer stack and a lower most surface of the upper metal layer stack, and
        the upper most surface of the protrusions of the lower metal layer stack do not physically contact the upper metal layer stack.

2. The bonding pad of claim 1, wherein the fragile layer is a low k dielectric layer.

3. The bonding pad of claim 1, wherein the hard dielectric layer is a silicon dioxide layer.

4. The bonding pad of claim 1, wherein the lower metal layer stack comprises a lower layer of titanium, an intermediate layer of titanium nitride, an upper layer of aluminum, and an overlying layer of titanium nitride.

5. The bonding pad of claim 1, wherein the upper metal layer stack comprises a lower layer of titanium, an intermediate layer of titanium nitride, and an upper layer of aluminum.

6. The bonding pad of claim 1, wherein the lower metal layer stack comprises a barrier layer of titanium nitride and an upper layer of copper.

7. The bonding pad of claim 1, wherein the upper metal layer stack comprises a layer of titanium nitride and an upper layer of copper.

8. The bonding pad of claim 1, wherein the upper metal layer stack comprises a layer of titanium nitride, an upper layer of copper, and an overlying layer of at least one of silicon carbide and silicon nitride.

9. The bonding pad of claim 1, wherein the upper metal layer stack includes a lower layer of titanium having a thickness that is no greater than about one hundred angstroms.

10. The bonding pad of claim 1, wherein the voids in the upper metal layer stack are formed in an array of intersecting lines and the protrusions in the upper metal layer stack are pillar shaped.

11. The bonding pad of claim 1, wherein the voids in the upper metal layer stack are formed in an array of non intersecting lines and the protrusions in the upper metal layer stack are bar shaped.

12. A monolithic integrated circuit including the bonding pad of claim 1.

13. A packaged integrated circuit having a monolithic integrated circuit including the bonding pad of claim 1.

* * * * *